United States Patent
Ohba et al.

(10) Patent No.: US 7,612,452 B2
(45) Date of Patent: Nov. 3, 2009

(54) METHOD FOR MANUFACTURING A SEMICONDUCTOR DEVICE AND SEMICONDUCTOR DEVICE

(75) Inventors: Yoshiyuki Ohba, Kanagawa (JP); Toshihiko Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 239 days.

(21) Appl. No.: 11/850,332

(22) Filed: Sep. 5, 2007

(65) Prior Publication Data

US 2008/0054467 A1    Mar. 6, 2008

(30) Foreign Application Priority Data

Sep. 6, 2006    (JP) .............................. 2006-241039

(51) Int. Cl.
*H01L 23/52*    (2006.01)
(52) U.S. Cl. .............................. 257/751; 257/E21.495; 257/E21.141; 438/653
(58) Field of Classification Search ................ 257/751, 257/E21.495, E23.141; 438/653
See application file for complete search history.

(56) References Cited

U.S. PATENT DOCUMENTS

| | | | | |
|---|---|---|---|---|
| 7,507,666 B2 * | 3/2009 | Nakao et al. | ................. | 438/687 |
| 2005/0218519 A1 * | 10/2005 | Koike et al. | ................. | 257/756 |
| 2007/0059919 A1 * | 3/2007 | Ooka | .......................... | 438/618 |

FOREIGN PATENT DOCUMENTS

| | | |
|---|---|---|
| JP | 2004-063859 | 2/2004 |
| JP | 2005-340601 | 12/2005 |
| JP | 2007-012996 | 1/2007 |

OTHER PUBLICATIONS

Japanese Office Action issued on Nov. 25, 2008, corresponding to Japanese Patent Application No. 2006-241039.
T. Usui et al.; Low Resistive and Highly Reliable Cu Dual-Damascene Interconnect Technology Using Self-Formed MnSixOy Barrier Layer; IEEE International Interconnect Technology Conference in 2005; pp. 188-190.

* cited by examiner

*Primary Examiner*—Trung Dang
(74) *Attorney, Agent, or Firm*—Sonnenschein Nath & Rosenthal LLP

(57) ABSTRACT

A method for manufacturing a semiconductor device includes: the first step of forming, in an insulating film provided on a substrate, a recess that is porositized at least at inner walls; the second step of forming an alloy layer made of copper and a metal other than copper so as to cover the inner walls of the recess; the third step of burying a conductive layer made primarily of copper in the recess provided with the alloy layer; the fourth step of subjecting the thus treated substrate to thermal treatment to cause the metal in the alloy layer to react with a constituent component of the insulating film to form a barrier film made of a metal compound having Cu diffusion barrier properties.

11 Claims, 12 Drawing Sheets

METHOD FOR MANUFACTURING A SEMICONDUCTOR DEVICE AND SEMICONDUCTOR DEVICE

CROSS REFERENCES TO RELATED APPLICATIONS

The present invention contains subject matter related to Japanese Patent Application JP 2006-241039 filed with the Japan Patent Office on Sep. 6, 2006, the entire contents of which being incorporated herein by reference.

BACKGROUND OF THE INVENTION

1. Field of the Invention

This invention relates to a method for manufacturing a semiconductor device and also to a semiconductor device. More particularly, the invention relates to a method for manufacturing a semiconductor device having a damascene structure wherein a self-formed barrier film is provided between a wiring or via and an interlayer insulating film and also to such a semiconductor device.

2. Description of the Related Art

In copper (Cu) wiring formation process of a semiconductor device, it is general to use a damascene method wherein a wiring pattern is formed by burying a wiring groove formed in an interlayer insulating film. For the formation of Cu wiring according to the damascene method, a barrier film made of tantalum, tantalum nitride (TaN) or the like is formed in a thickness of about 10 nm, prior to the burying of Cu, so as to prevent Cu from being diffused into the interlayer insulating film. Thereafter, a Cu layer is buried in the wiring groove provided therein with a barrier layer according to an electrolytic plating technique.

However, for the reasons that as wiring pitches become finer, a level of difficulty involved in burying of Cu increases and a ratio of the barrier film to a total volume of wirings increases, resulting in a rise of wiring resistance, there has been proposed a following technique. The technique wherein a seed layer made of a Mn-containing Cu layer is formed without formation of a barrier film, followed by thermal treatment to diffuse Mn thereby forming, between the interlayer insulating film and the Cu wiring, a self-formed barrier film made of a Mn compound having a thickness of about 2 to 3 nm has been proposed. (See, for example, Low Resistive and Highly Reliable Cu Dual-Damascene Interconnect Technology using Self-formed MnSixoy Barrier Layer, "IEEE International Interconnect Technology Conference in 2005", pp. 188 to 190).

The self-formed barrier process is illustrated with reference to FIGS. 7A to 7C. As shown in FIG. 7A, an interlayer insulating film 12 made of silicon oxide (SiO$_2$) is formed on a substrate formed of a silicon wafer, after which a contact hole 13 arriving at the substrate 11 is formed in the interlayer insulating film 12, followed by burying a via 14 made, for example, of tungsten (W) in the contact hole 13.

Next, an interlayer insulating film 15 made of SiO$_2$ is formed over the interlayer insulating film 12 including the via 14. Subsequently, a wiring groove 16 arriving at the interlayer insulating film 12 and the via 14 is formed in the interlayer insulating film 15, followed by formation of an alloy layer 17 made of CuMn over the interlayer insulating film 15 so that inner walls of the wiring groove 16 are covered therewith. This alloy layer 17 functions as a seed layer in a subsequent electrolytic plating method.

Next, as shown in FIG. 7B, a conductive layer 18 made of pure Cu is formed on the alloy layer 17 according to the electrolytic plating method in such a way that the wiring groove 16 is buried.

As shown in FIG. 7C, thermal treatment is carried out to cause Mn present in the alloy layer 17 to react with the constituent component in the interlayer insulating films 12, 15, thereby forming a self-formed barrier film 19 made of an Mn compound at the interfaces between the alloy layer 17 and the interlayer insulating films 12, 15. This self-formed barrier film 19 is formed in a thickness of 2 nm to 3 nm. At this stage, Mn is segregated at a surface side of the conductive layer 18, thereby forming a manganese oxide (MnO) layer M.

Thereafter, although not shown in the figure, the conductive layer 18 and the self-formed barrier layer 19 at portions thereof unnecessary for a wiring pattern are removed along with the MnO layer M according to a chemical mechanical polishing (CMP) method, followed by polishing down the exposed interlayer insulating film 15 at a surface side thereof to provide a wiring in the wiring groove 16.

In the wiring structure formed according to such a fabrication method as set out above, the burying characteristic of the conductive layer 18 is better over the case of a burying process using an ordinary barrier film made of Ta or TaN because of the formation of the thinned, self-formed barrier film 19 by reaction between Mn in the alloy layer 17 and the constituent component of the interlayer insulating films 12, 15. When compared with the barrier film made of Ta or TaN, the self-formed barrier film 19 is thinner, with the attendant advantage that the resulting wiring can be made low in resistance.

SUMMARY OF THE INVENTION

In the step, illustrated with reference to FIG. 7C, of the above-stated fabrication method, Mn in the alloy layer 17 and the constituent component of the interlayer insulating films 12, 15 are reacted to form the self-formed barrier film 19 at the interface therebetween. However, as shown in FIG. 8, if the formation of the self-formed barrier layer 19 is inadequate, adhesion between the conductive layer 18 and the interlayer insulating films 12, 15 lowers. Especially, if the formation of the self-formed barrier film 19 is inadequate at an initial stage of the thermal treatment, the conductive layer 18 separates or comes off due to an abrupt change in stress through the thermal treatment. In a subsequent CMP step, the conductive layer 18 receives a lateral stress by the polishing, with a problem that the conductive layer 18 is liable to come off or separate.

To cope with this, it is effective to make a high concentration of Mn in the alloy layer 17. Since Mn is higher in resistance than Cu, there arise problems in that not only a wiring resistance increases if Mn remains in the wiring, but also the sheet resistance of the alloy layer 17 increases, so that a load is burdened on the process wherein the conductive layer is buried by the plating method.

In view of the foregoing, the invention has a need for the provision of a method for manufacturing a semiconductor device wherein the conductive layer is prevented from separation without making a high concentration of Mn in an alloy layer (seed layer) and also such a semiconductor device obtained by the method.

In order to achieve the above need, a first manufacturing method of a semiconductor device according to an embodiment of the present invention is characterized by including the following steps conducted successively. Initially, the first step is one wherein an insulating film provided on a substrate is formed with a recess that is rendered porous or is porositized at least at an inner wall side. Next, in the second step, an alloy layer made of copper and a metal other than copper is formed so as to cover inner walls of the recess. In the third step, a conductive layer made primarily of copper is buried in the recess provided with the alloy layer. Subsequently, the fourth step is carried out such that thermal treatment is effected to cause the metal in the alloy layer to react with a constituent component of the insulating film to form a barrier film made of a metal compound having Cu diffusion barrier properties.

A first semiconductor device of an embodiment of the present invention includes an insulating film formed on a substrate and a conductive layer buried in a recess formed in the insulating film and made primarily of Cu, characterized in that at least a part of the insulating film at a side of interface with the conductive layer is rendered porous or is porositized and a barrier film made of a metal compound, which is formed by reaction between the insulating film and a metal other copper and has copper diffusion barrier properties, at an interface between the conductive layer and the insulating film.

According to the first manufacturing method of a semiconductor device and the first semiconductor device thus obtained, since at least a part of the insulating film constituting the inner wall side of the recess is porositized, the porous portion is lower in density than the non-porous insulating film, by increasing a surface roughness at the inner walls of the recess. In doing so, when the thermal treatment is carried out in the fourth step wherein the metal in the alloy layer is reacted with a constituent component in the insulating film, a segregation site for the metal in the alloy layer increases in number. This facilitates the above reaction by promoting the formation of a self-formed barrier film at the interface between the alloy layer and the insulating film. The porous portion is likely to absorb moisture, and oxygen is supplied from the moisture at the interface between the alloy layer and the insulating film, so that the reaction between the metal in the alloy layer and the constituent component of the insulating film is facilitated, by promoting the formation of the self-formed barrier film.

A second manufacturing method of a semiconductor device is characterized by conducting the following steps successively. In the first step, a recess is formed in an insulating film formed on a substrate. In the second step, the insulating film is subjected to plasma treatment to form, at an inner wall side of the recess, a modified layer whose density is lower that that of the insulating film. Next, in the third step, an alloy layer made of copper and a metal other than copper is formed on the modified layer so that the inner walls of the recess are covered. Subsequently, in the fourth step, a conductive layer made primarily of copper is buried in the recess provided with the alloy layer. In the fifth step, thermal treatment is carried out to cause the metal in the alloy layer to react with a constituent component of the modified layer to form a barrier film made of a metal compound having copper diffusion barrier properties at an interface between the alloy layer and the modified layer.

Further, a second semiconductor device of the invention includes an insulating film formed on a substrate, and a conductive layer which is buried in a recess formed in the insulating film and is made primarily of copper, characterized in that a modified layer whose density is lower than the insulating film is provided at an interface between the conductive layer and the modified layer.

According to the second manufacturing method of a semiconductor device and the second semiconductor device thus obtained, since the modified layer whose density is lower than the insulating film is formed at an inner wall side of the recess, the surface roughness of the insulating film at a side of the inner walls of the recess increases. This, in turn, increases metal segregation sites on or in the alloy layer when thermal treatment is carried out at the fifth step in order to cause the metal in the alloy layer to react with the constituent component of the insulating film. Consequently, the reaction is facilitated and the formation of the self-formed modified layer at the interface between the alloy layer and the modified layer is also facilitated. Additionally, the modified layer is likely to absorb moisture, and oxygen is supplied from the moisture at the interface between the alloy layer and the modified layer, by facilitating the reaction between the metal in the alloy layer and the constituent component of the modified layer to promote the formation of the self-formed barrier film.

As stated hereinabove, according to the manufacturing method of a semiconductor device and the semiconductor device of an embodiment of the present invention, the formation of the self-formed barrier film at the interface between the alloy layer and the insulating layer is facilitated, for which a continuous self-formed barrier layer is likely to be formed at an initial stage of the thermal treatment. This leads to improved adhesion between the conductive layer and the insulating layer, thus enabling the conductive layer to be prevented from separation. Hence, the yield of the semiconductor device can be improved.

DETAILED DESCRIPTION OF THE PREFERRED EMBODIMENTS

Embodiments of the invention are described in detail with reference to the drawings. It will be noted that in the respective embodiments, the configuration of a semiconductor device according to an embodiment of the present invention is illustrated in successive manufacturing steps.

First Embodiment

This embodiment is an example embodying a manufacturing method of a semiconductor device according to an embodiment of the present invention and relates to formation of a single damascene wiring structure. A first embodiment of the invention is illustrated with reference to the sectional views of FIGS. 1A to 1F showing manufacturing steps, respectively. It is to be noted that like members or parts as in Description of the Related Art are indicated by like reference symbols.

Figure 1A:
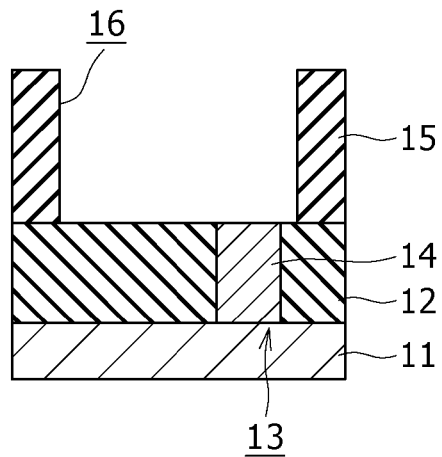
FIGS. 1A to 1F are, respectively, a sectional view showing a manufacturing step illustrating a first embodiment relating to a manufacturing method of a semiconductor device according to an embodiment of the present invention.

As shown in FIG. 1A, a non-porous interlayer insulating film 12 made, for example, of $SiO_2$ is formed on a substrate 11 constituted of a silicon wafer in which an element such as a transistor has been formed. Thereafter, a contact hole 13 arriving at the substrate 11 is formed and a via 14 made, for example, of W is formed as buried in the contact hole 13.

Next, a non-porous interlayer insulating film 15 made, for example, of $SiO_2$ is formed in a thickness of 500 nm on the interlayer insulating film 12 including the via 14, for example, according to a plasma enhanced chemical vapor deposition (PECVD) method using silane ($SiH_4$) as a film-forming gas.

Thereafter, a resist pattern (not shown) having a wiring groove pattern is formed on the interlayer insulating film 15, followed by formation of a wiring groove 16 (recess) in the interlayer insulating film 15 by an etching technique using the resist pattern as a mask in such a way as to arrive at the interlayer insulating film 12 and the via 14. Because a porous insulating film (porous film) is formed in a subsequent step to cover the wiring groove 16, the wiring groove 16 is opened widely sufficient to cover the formation of the porous film.

Figure 1B:
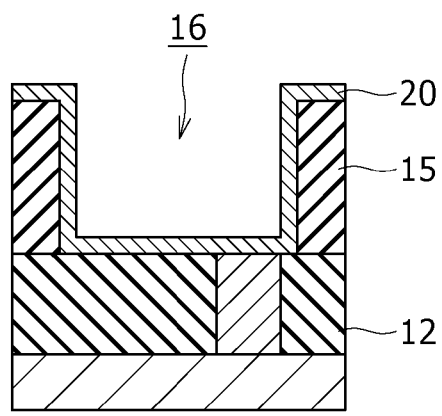

Subsequently, as shown in FIG. 1B, a porous film 20 made, for example, of a porous carbon-containing silicon oxide (SiOC) film is formed on the interlayer insulating film 15 so as to cover the inner walls of the wiring groove 16. Since this porous film 20 is lower in density than the non-porous interlayer insulating films 12, 15, the surface roughness at the inner wall side of the wiring groove 16 increases. In doing so, when, in a subsequent step, an alloy layer made of CuMn is formed on the porous film 20, a conductive layer is formed so as to bury the wiring groove 16 therewith, and thermal treatment is carried out to cause Mn in the alloy layer to react with a constituent component of the porous film 20, segregation sites of Mn increase in number on or in the surface of the porous film 20. In this way, the above reaction is facilitated thereby promoting the formation of a self-formed barrier film at the interface between the alloy layer and the porous film 20. In addition, the porous film 20 is more likely to absorb moisture than the non-porous interlayer insulating films 12, 15 and thus, oxygen is supplied from the moisture to the interface between the alloy layer and the porous film, thus leading to facilitation of the reaction and resulting in further promotion of the formation of the self-formed barrier film.

The density of the porous film 20 is preferably at 1.5 g/cm$^3$ or below. When the porous film 20 whose density is within such a range as indicated above is in contact with an alloy layer described hereinafter, the formation of the self-formed barrier film is reliably promoted. It will be noted that in the formation of the self-formed barrier film, the density is preferably as low as possible, and if the density is too low, there may occur film damage or separation of the porous film, for which the density is at 0.7 g/cm$^3$ or over, preferably at 1.0 g/cm$^3$ or over. The porous film 20 is formed in a thickness of from 1 nm to 10 nm, and the porous film 20 is formed herein, for example, at a density of 1.25 g/cm$^3$ in a thickness of 5 nm.

The porous SiOC film serving as the porous film 20 is formed, for example, in the following manner. Initially, a non-porous insulating film is formed at a film-forming temperature of 350° C. according to a PE-CVD method using a film-forming gas containing a silane gas such as trimethylsilane (3MS), tetramethylsilane (4MS), octamethylcyclotetrasiloxane (OMCTS), tetrametylcyclotetrasiloxane (TMCTS) or the like, and a poregen source formed of an organic gas. Thereafter, curing is effected by thermal treatment at 200° C. or over or by electron beam irradiation to porositize or cavitate the insulating film. An instance of the electron beam irradiation conditions includes those conditions of an atmosphere of helium (He), an accelerated voltage of 13 KeV, a temperature of 350° C., an electric current of 2000 μA or over and a pressure of 8.65 kPa or below.

It will be noted that although assuming herein that the porous film 20 is made of a porous SiOC film, no limitation is placed thereon so far as there is used a porous film 20 that is capable of being so formed as to cover the inner walls of the wiring groove 16. For instance, other type of porous film such as a porous $SiO_2$ film or the like may be formed by a PECVD method.

Figure 1C:
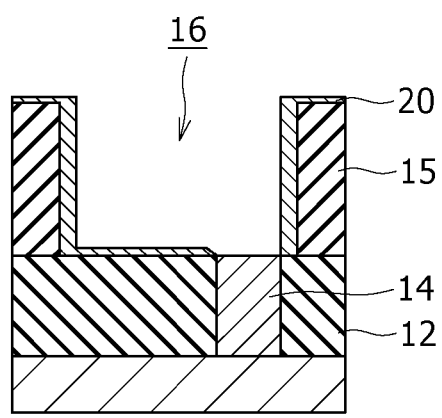

Next, as shown in FIG. 1C, the via 14 at the bottom of the wiring groove 16 is exposed at the surface thereof, for example, by etching back. This entails the porous film 20 being thinly left on the interlayer insulating film 12 at the bottom of the wiring groove 16 and also on the interlayer insulating film 15.

Figure 1D:
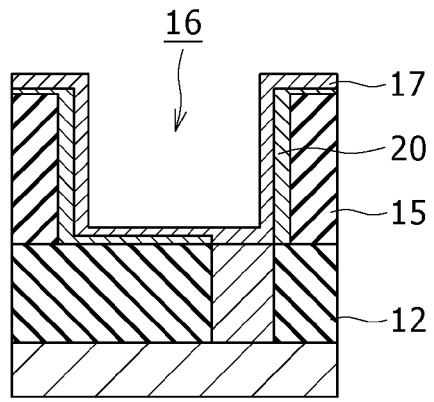

Next, as shown in FIG. 1D, an alloy layer 17 made of CuMn is formed on the porous film 20 so as to cover the inner walls of the wiring groove 16 according to a physical vapor deposition (PVD) method, such as a sputtering method, using, for example, an alloy target made, for example, of CuMn. This alloy layer 17 serves as a seed layer when the wiring groove 16 is buried in a subsequent step according to an electrolytic plating method. This porous film 20 is more likely to receive a knock-on effect of ion by a sputtering method than the non-porous interlayer insulating films 12, 15, so that the surface roughness of the porous film 20 increases, thereby increasing segregation sites of Mn in the alloy layer 17.

Mn in the alloy layer 17 forms a self-formed barrier film by reaction with the constituent component of the porous film 20 when thermal treatment is carried out in a subsequent step. To this end, the concentration of Mn in the alloy layer 17 and the thickness of the alloy layer 17 should be at levels not smaller than a Mn concentration and a layer thickness sufficient to permit a continuous self-formed barrier film to be formed by a subsequent thermal treatment step at an interface between the alloy layer 17 and the interlayer insulating films 12, 15. The concentration of Mn in the alloy layer 17 and the thickness of the alloy layer 17 should also be at levels not larger than a Mn concentration and a layer thickness within tolerance ranges of wiring resistance in case where Mn is left in the wiring formed inside the wiring groove 16.

More particularly, the concentration of Mn in the alloy layer 17 is within a range of from 1 atomic percent to 10 atomic percent, preferably from 2 atomic percent to 6 atomic percent. The thickness of the alloy layer 17 is set, in addition to the upper limit within such a range as defined above, at a level of not larger than a thickness which does not act to degrade a burying characteristic of a conductive layer formed by a plating method. More specifically, the thickness of the alloy layer 17 ranges from 20 nm to 80 nm, and the layer is formed herein in a thickness, for example, of 60 nm.

Figure 1E:
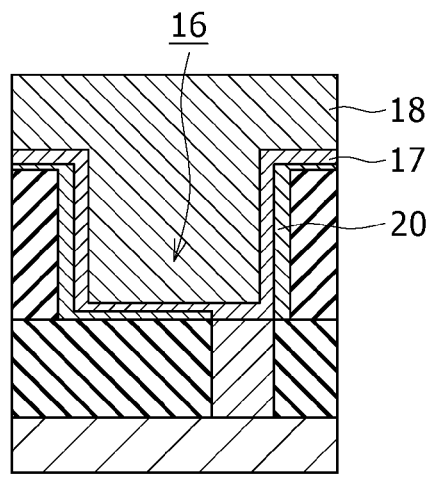

Next, as shown in FIG. 1E, a conductive layer 18 made, for example, of pure Cu is formed in a thickness of not smaller than 800 nm on the alloy layer 17, for example, by an electrolytic plating method in such a way as to bury the wiring groove 16 therewith.

It will be noted that although an instance of using pure Cu as the conductive layer 18 has been illustrated herein, the conductive layer 18 that contains Cu as a main component may also be usable and, for example, an CuAg alloy which undergoes a slight rise in specific resistance may be used. Although an instance of forming the conductive layer 18 by an electrolytic plating method has been illustrated herein, the conductive layer 18 may be formed, for example, by a PVD method such as a sputtering method or the like.

Figure 1F:
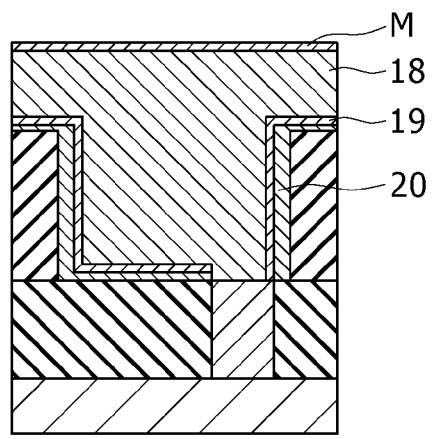

Thereafter, as shown in FIG. 1F, thermal treatment is carried out, for example, at 300° C. for 30 minutes to cause Mn in the alloy layer 17 (see FIG. 1E) to react with the constituent component of the porous film 20 thereby forming a self-formed barrier film 19 having anti-diffusion properties of Cu at the interface between the alloy layer 17 and the porous layer 20. In order to ensure reliable formation of the self-formed barrier film 19 and prevent an adverse influence on the device by the thermal treatment, the thermal treatment for forming the self-formed barrier film 19 is preferably carried out at a temperature ranging from 200° C. to 400° C. for a time of 60 seconds to 2 hours, more preferably 60 seconds to 30 minutes. The constituent component of the porous film 20 may contain oxygen or moisture from air adsorbed on the surface of the porous film 20.

The porous film 20 is constituted of a porous SiOC film herein, so that the self-formed barrier film 19 is formed of a Mn compound such as a silicon-containing Mn oxide (Mn-$Si_xO_y$) or a Mn oxide ($Mn_xO_y$) or the like and is formed in a thickness of 2 nm to 3 nm. The thermal treatment permits Mn to be segregated at a surface side of the conductive layer 18 thereby forming a MnO layer M.

As stated hereinabove, the porous film 20 is lower in density than the non-porous interlayer insulating films 12, 15, for which the surface roughness of the inner walls of the wiring groove 16 increases and thus, the number of Mn segregation sites increases, thereby facilitating the formation of the self-formed barrier film 19. Since the surface roughness of the porous film 20 increases, the film is more likely to absorb moisture thereon. As shown in the following reaction formula (1), for example, the formation reaction of the self-formed barrier film 19 made, for example, of $MnSi_xO_y$ is further facilitated by the presence of the moisture

[Reaction Formula 1]

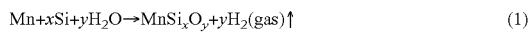

$$Mn + xSi + yH_2O \rightarrow MnSi_xO_y + yH_2(gas)\uparrow \quad (1)$$

Since the formation of the self-formed barrier film 19 is facilitated as set forth hereinabove, a continuous self-formed barrier film is likely to be formed at an initial stage of the thermal treatment. This leads to improved adhesion between the conductive layer 18 and the interlayer insulating films 12, 15, thereby preventing the conductive layer 18 from separation as would be caused by abrupt change of stress at the initial stage of the thermal treatment. Additionally, it becomes possible to ensure a broad margin of thermal treating conditions.

Figure 2:
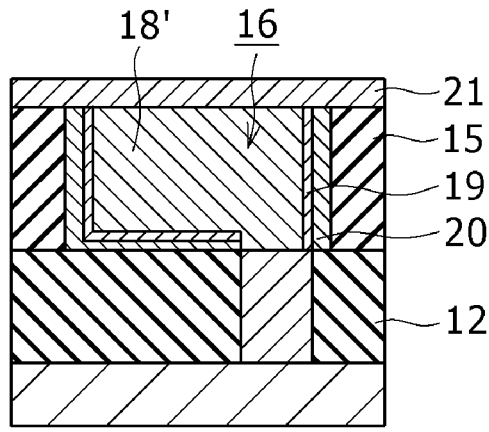
FIG. 2 is another sectional view showing a manufacturing step illustrating a first embodiment relating to the method for manufacturing a semiconductor device according to an embodiment of the present invention.

Subsequently, as shown in FIG. 2, two-stage polishing is performed, for example, by a CMP method. At the first stage, portions of the conductive layer 18 unnecessary for the wiring pattern (see FIG. 1F) are removed along with the MnO layer M (see FIG. 1F). At the second stage of polishing, the self-formed barrier film 19 is removed and the exposed interlayer insulating film 15 is polished down by 100 nm. In doing so, a wiring 18' made of Cu is formed in the wiring groove 16. As set out hereinabove, the continuous self-formed barrier film 19 has been provided at the interface between the conductive layer 18 and the porous film 20, so that the conductive layer 18 is prevented from separation even under high head pressure CMP conditions. Thus, it is possible to ensure a broad margin of the CMP conditions.

Next, rinsing with an organic acid such as a citric acid aqueous solution or an oxalic acid aqueous solution is carried out to remove an anticorrosive for Cu, such as a benzotriazole derivative, left on the surface of the oxide film on the wiring 18' and the surface of the wiring 18' in the CMP step. Thereafter, according to a CVD method using film-forming gases such as a silicon-containing material such as 3MS and ammonia ($NH_3$) and the like, there is formed a 50 nm thick cap film 21 made, for example, of silicon carbide nitride (SiCN) on the wiring 18' and the interlayer insulating film 15.

According to the manufacturing method of a semiconductor device and the semiconductor device obtained by the method, when the porous film 20 is so formed as to cover the inner walls of the wiring groove 16, the formation of the self-formed barrier film 19 at the interface between the alloy layer 17 and the porous film 20 is facilitated. This leads to the likelihood of forming the continuous self-formed barrier film 19 at the initial stage of the thermal treatment and thus, adhesion between the conductive layer 18 and the porous film 20 is improved, thereby enabling the conductive layer 18 to be prevented from separation. In the subsequent CMP step, the conductive layer 18 can be prevented from separation. Accordingly, the yield of the semiconductor device can be improved.

It will be noted that although there has been illustrated herein an instance of rendering the inner wall side of the wiring groove 16 porous by forming the porous film 20 so as to cover the inner walls of the wiring grove 16 as is particularly shown in FIG. 1B, the interlayer insulating films 12, 15 may be constituted of a porous film, respectively. In the latter case, there may be used a coating-formable porous film aside from a porous SiOC film and a porous $SiO_2$ film used as the porous film 2 formed by such a PECVD method as stated hereinabove. Such porous films include, for example, a coated film of a porous SiCO film, and organic coated films such as a porous polyaryl ether (porous PAE) film, a porous polyarylene (porous PAr) film and the like. Where the interlayer insulating films 12, 15 per se are rendered porous or are porositized, the strength becomes low with the possibility that there may not be obtained a CMP resistance. Thus, it is preferred from the standpoint of strength that the porous film 20 is formed so as to cover the inner walls of the wiring groove 16 therewith. Where the interlayer insulating films 12, 15 are constituted of an organic coated film, respectively, a Mn carbide ($Mn_xC_y$) may be formed as the self-formed barrier film 19 in some case.

Figure 3:
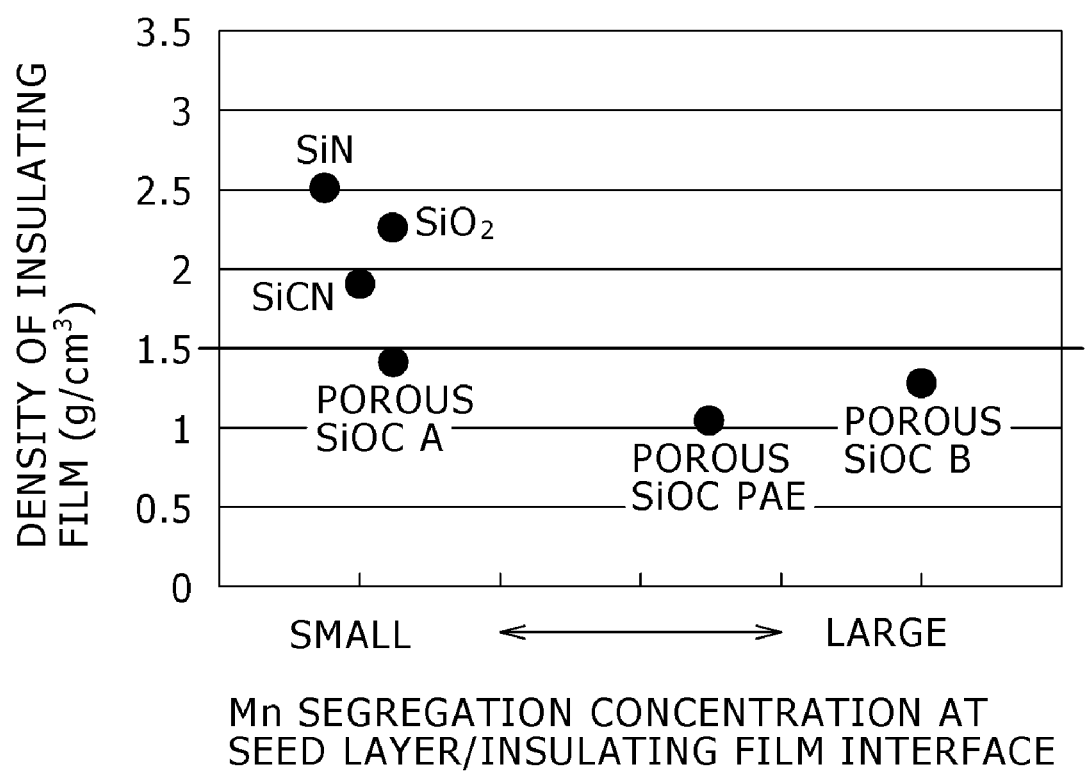
FIG. 3 is a graph showing the relation between the density of an insulating film and the concentration of Mn segregated at the interface between an alloy layer and an insulating layer.

The relation between the density of an insulating film and the Mn concentration segregated at the interface between an alloy layer and the insulating layer in case where a self-formed barrier film made of a Mn compound is formed between the alloy layer (seed layer) and the insulating film is shown in a graph of FIG. 3 for different types of insulating films having different densities.

As shown in the graph, it has been confirmed that a lower density of the insulating film results in a higher Mn concentration segregated at the interface between the seed layer and the insulating film. Especially, it has been confirmed that when using, as an insulating film, a porous film having a density not higher than 1.5 $g/cm^3$, the Mn concentration becomes high.

(Modification 1)

Although the porous film 20 has been formed herein so as to cover the inner walls of the wiring groove 16 so that the wiring groove 16 is rendered porous at the inner wall side thereof to make a low density portion as is shown in FIG. 1B, the wiring groove 16 may be rendered low in density at a side of the inner walls thereof according to the following procedure.

Figure 4A:
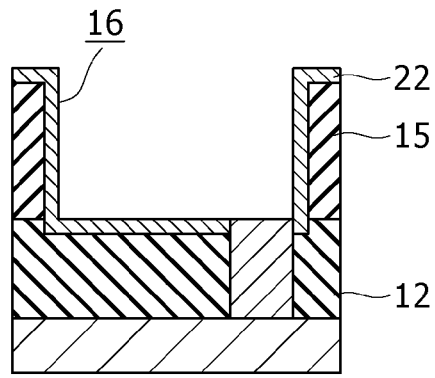
FIGS. 4A to 4C are, respectively, a sectional view illustrating a modification of the first embodiment.

As shown in FIG. 4A, a wiring groove 16 arriving at an interlayer insulating film 12 and a via 14 is formed in an interlayer insulating film 15. Next, the interlayer insulating films 12, 15 provided in the wiring groove 16 are subjected to plasma treatment, so that a modified layer 22 whose density is lower than the interlayer insulating films 12, 15 is formed at the inner wall side of the wiring groove 16. This modified layer 22 is increased in surface roughness over the non-porous interlayer insulating films 12, 15, for which when an alloy layer made of CuMn is formed on the modified layer 22 in a subsequent step to form a conductive layer as buried in the wiring groove 16 and is thermally treated to cause Mn in the alloy layer to react with the constituent component of the modified layer 22, segregation sites of Mn in the surface of the modified layer 22 increase in number. Thus, the reaction is facilitated to promote the formation of a self-formed barrier film at the interface between the alloy layer and the modified layer 22. The modified layer 22 is more likely to absorb moisture than the non-porous interlayer insulating films 12, 15, and oxygen is supplied from the moisture to the interface between the alloy layer and the modified layer, resulting in further facilitation of the reaction and also of the formation of the self-formed barrier film.

The density of the modified layer 22 is preferably at 1.5 g/cm$^3$ or below. When the modified layer having a density within such a range as indicated above is in contact with an alloy layer described hereinafter, the formation of the self-formed barrier film is reliably ensured. It will be noted that in the formation of the self-formed barrier film, the density is preferably as low as possible, and if the density is too low, there may occur film damage or separation of the modified film 22, for which the density is at 0.7 g/cm$^3$ or over, preferably at 1.0 g/cm$^3$ or over. The modified film 22 is formed such that the distance from the inner wall surface of the wiring groove 16 is within a range of from 1 nm to 10 nm. The modified film 22 is formed herein in such a way that the density is at 1.3 g/cm$^3$ and the above distance is at 5 nm.

The plasma treatment for forming the modified layer 22 is carried out under such conditions as not to permit the interlayer insulating films 12, 15 to be thinned too much but to permit the interlayer insulating films 12, 15 constituting the inner walls of the wiring groove 16 to be roughened in the surface thereof. For an example of the plasma treating conditions, the plasma treatment is carried by use of a two frequency capacitance coupled plasma etcher using, as a gas to be treated, carbon tetrafluoride ($CF_4$) whose flow rate is set at 500 ml/minute. The plasma treatment includes conditions of an upper electrode power of 1000 W at the top thereof, a lower electrode (bias) power of 1000 W at the bottom thereof, a treating pressure of 5.32 Pa, helium pressures, exerted on a back side of the substrate (wafer) 11, of 1.3 kPa at a center side thereof and 4.7 kPa at an edge side, and treating temperatures of 60° C. at the upper electrode and side walls and 20° C. at the lower electrode. The treating time is set at 10 seconds. These plasma treating conditions are so set that, for example, the lower electrode power and treating pressure are both lower than those of the plasma treating conditions used to form the wiring groove 16.

Figure 4B:
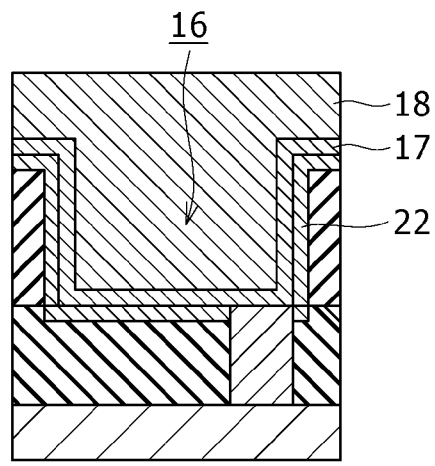

Subsequent steps are carried out in the same manner as in the first embodiment. More particularly, as shown in FIG. 4B, an alloy layer 17 made of CuMn is formed on the modified layer 22 so as to cover the inner walls of the wiring groove 16 therewith. Next, a conductive layer 18 is formed on the alloy layer 17 as burying the wiring groove 16 therewith according to an electrolytic plating method.

Figure 4C:
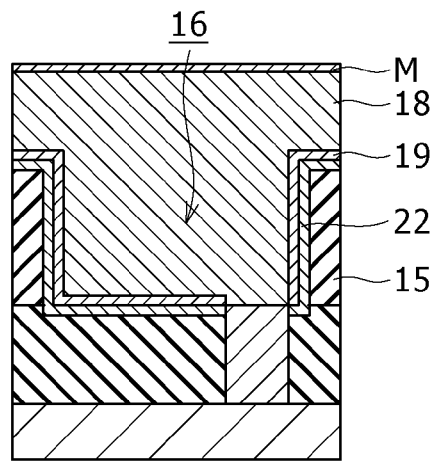

Subsequently, as shown in FIG. 4C, thermal treatment is carried out, for example, at 300° C. for 30 minutes to cause Mn in the alloy layer 17 (see FIG. 4B) to react with the constituent component of the modified layer 22 thereby forming a self-formed barrier film 19 having anti-diffusion properties of Cu at the interface between the alloy layer 17 and the modified layer 22. The modified layer 22 used herein is formed of a $SiO_2$ film rendered low in density, so that the self-formed barrier film 19 is constituted of an Mn compound such as a silicon-containing Mn oxide ($MnSi_xO_y$) or Mn oxide ($Mn_xO_y$) or the like and is formed in a thickness of 2 nm to 3 nm. The thermal treatment causes Mn to be segregated at the surface side of the conductive layer 18, thereby forming a MnO layer M.

As stated hereinabove, the modified layer 22 is lower in density than the non-porous interlayer insulating films 12, 15 and has an increased surface roughness, for which like the first embodiment, the number of segregation sites of Mn increases, thereby promoting the formation of the self-formed barrier film 19. Since the surface roughness of the modified layer 22 increases, moisture is likely to be absorbed and the formation reaction of the self-formed barrier film 19 is also promoted by means of the moisture.

As set out above, since the formation of the self-formed barrier film 19 is promoted, a continuous self-formed barrier film is likely to be formed even at an initial stage of the thermal treatment. This leads to an improvement in adhesion between the conductive layer 18 and the interlayer insulating films 12, 15, so that separation of the conductive layer 18 ascribed to an abrupt change of stress at an initial stage of the thermal treatment is prevented. To secure a broad margin of thermal treating conditions becomes possible.

Subsequent steps are carried out in the same manner as those steps illustrated with reference to FIG. 2 in the first embodiment. More particularly, two-stage polishing is performed, for example, according to a CMP method to permit the MnO layer M and the conductive layer 18 at portions thereof unnecessary for wiring pattern and also the self-formed barrier film 19 and an exposed interlayer insulating film 15 to be polished down, thereby forming a wiring made of Cu in the wiring groove 16. In this connection, since the continuous self-formed barrier film 19 is provided at the interface between the conductive layer 18 and the modified layer 22 as stated hereinabove, separation of the conductive layer 18 is prevented under CMP conditions including a high head pressure, thereby ensuring a broad margin of CMP conditions. Subsequently, rinsing with an organic acid is effected to remove an oxide film and an anticorrosive for Cu from the wiring, followed by formation of a cap film 21 made, for example, of SiCN over the wiring and interlayer insulating film 15.

When using the manufacturing method of a semiconductor device and the semiconductor device obtained by the method, the surface roughness of the inner walls of the wiring groove 16 increases owing to the formation, on the inner walls of the wiring groove 16, of the modified layer 22 that is lower in density than the interlayer insulating films 12, 15. Hence, the formation of the self-formed barrier film 19 is promoted at the interface between the alloy layer 17 and the modified layer 22. Accordingly, such effects as in the first embodiment can be achieved.

It will be noted that an instance using a non-porous $SiO_2$ film as the interlayer insulating films 12, 15 has been illustrated herein, and if the interlayer insulating film 12 or 15 is formed of a porous film such as a porous SiOC film or the like, the modified layer 22 may be formed as being further lower in density, resulting in further promotion of the formation of the self-formed barrier film 19.

Second Embodiment

A second embodiment relating to a manufacturing method of a semiconductor device according to an embodiment of the present invention is illustrated with reference to FIGS. 5A to 5L, each showing, in section, a manufacturing step of a semiconductor device. An instance of forming a dual damascene structure on the cap film illustrated with reference to FIG. 2 in the first embodiment is now described.

Figure 5A:
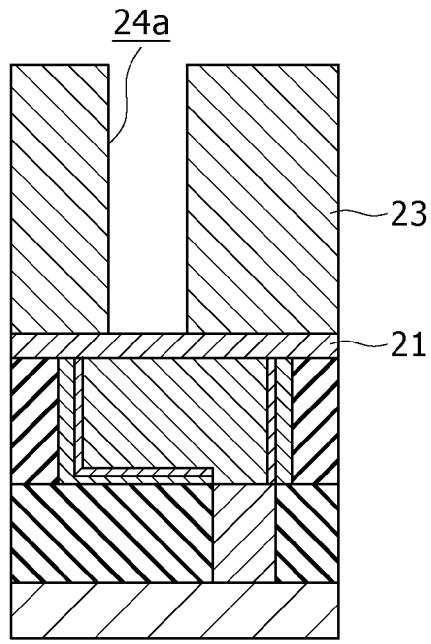
FIGS. 5A to 5L are, respectively, a sectional view showing a manufacturing step illustrating a second embodiment relating to a manufacturing method of a semiconductor device according to an embodiment of the present invention.

Initially, as shown in FIG. 5A, an interlayer insulating film 23 made, for example, of $SiO_2$ is formed on the cap film 21, for example, by a PE-CVD method in a thickness of 700 nm. Although assuming herein that the interlayer insulating film 23 is formed of a single-layer film of $SiO_2$, the interlayer insulating film 23 may have a hybrid structure wherein an organic insulating layer and an inorganic insulating layer are laminated.

Subsequently, a resist pattern (not shown) having a contact hole pattern is formed over the interlayer insulating film 23 and a contact hole 24a arriving at the cap film 21 is formed by etching using the resist pattern as a mask.

Figure 5B:
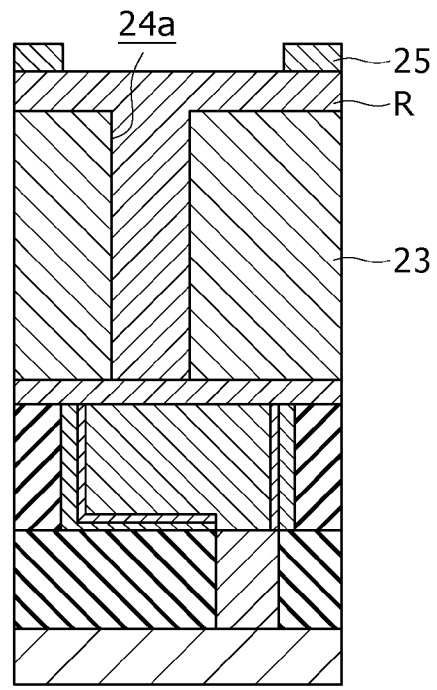

Next, as shown in FIG. 5B, a resist R is coated onto the interlayer insulating film 23 so that the contact hole 24a is buried therewith. Thereafter, an SOG (spin On Glass) film is formed on the resist R and a resist pattern (not shown) having a wiring groove pattern is formed on the SOG film, followed by etching using the resist pattern as a mask to process the SOG film, thereby forming a hard mask.

Figure 5C:
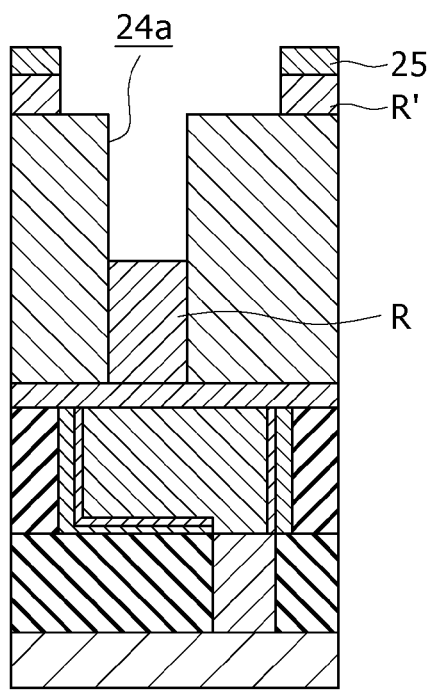

Next, as shown in FIG. 5C, according to etching using the hard mask 25, the resist R is processed to form a resist pattern R' having a wring groove pattern. The resist R covering the bottom side of the contact hole 24a is left.

Figure 5D:
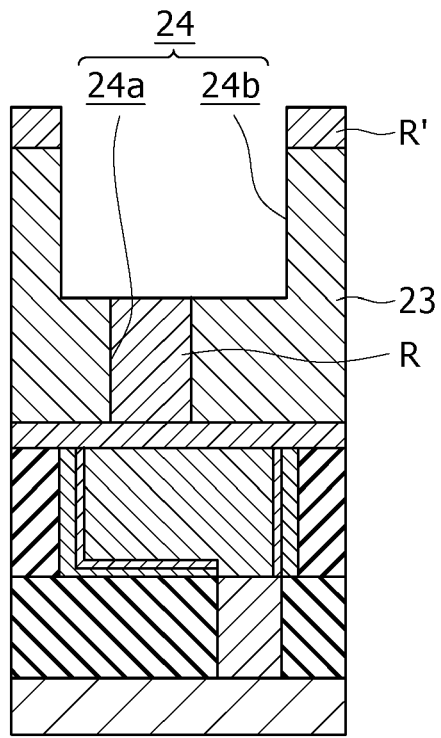

Subsequently, as shown in FIG. 5D, a wiring groove 24b in communication with the contact hole 24a is formed at the upper layer side of the interlayer insulating film 23 by etching using the hard mask 25 (see FIG. 5C) and the resist pattern R' as a mask. This enables a dual damascene opening 24 (recess) composing of the wiring groove 24b and the contact hole 24a communicated at the bottom thereof to be formed. The depth of the wiring groove 24b is controlled by controlling the etching time. The contact hole 24a is so set herein that an opening width is at 150 nm and a depth is at 110 nm, and the wiring groove 24b is so set that an opening width is at 75 to 100 nm and a depth is at 150 nm. Moreover, because the resist R is left inside the contact hole 24a, the side walls of the contact hole 24a is prevented from etching, so that the inner walls are kept vertical. The hard mask 25 is removed by this etching.

Figure 5E:
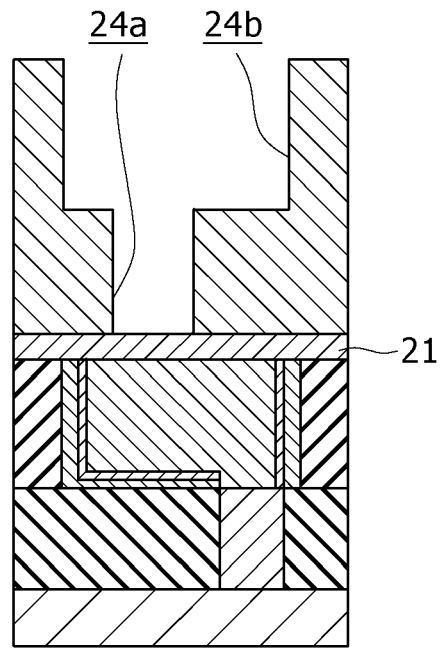

As shown in FIG. 5E, according to ashing and rinsing with a chemical, the resist pattern R' (see FIG. 5D) and the resist R are removed, thereby exposing the cap film 21 at the bottom of the contact hole 24a.

Figure 5F:
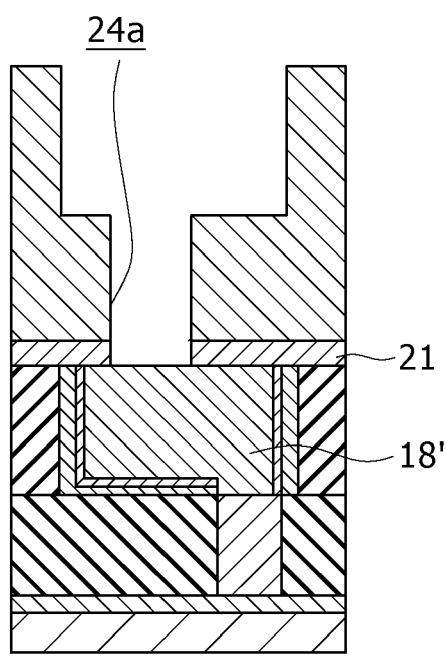

As shown in FIG. 5F, the cap film 21 at the bottom of the contact hole 24a is removed to expose the surface of the wiring 18'.

Figure 5G:
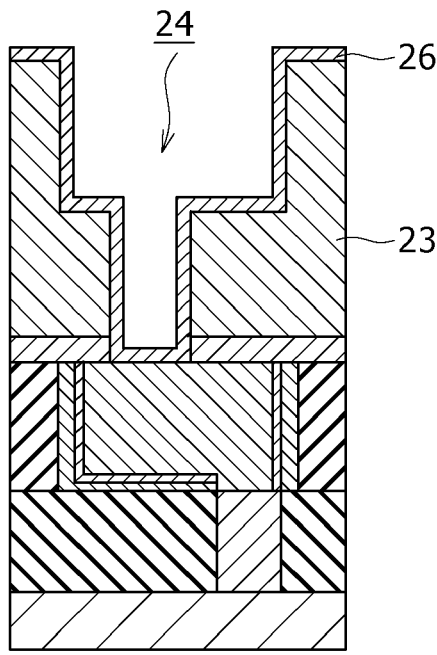

Thereafter, as shown in FIG. 5G, a porous film 26 made, for example, of a porous SiOC film is formed on the interlayer insulating film 23 so as to cover the inner walls of the dual damascene opening 24 in the same manner as in the first embodiment, for example, by a PE-CVD method. This porous film 26 preferably has a density of not higher than 1.5 $g/cm^3$, and the porous film 26 is formed as having a thickness of from 1 nm to 10 nm.

Figure 5H:
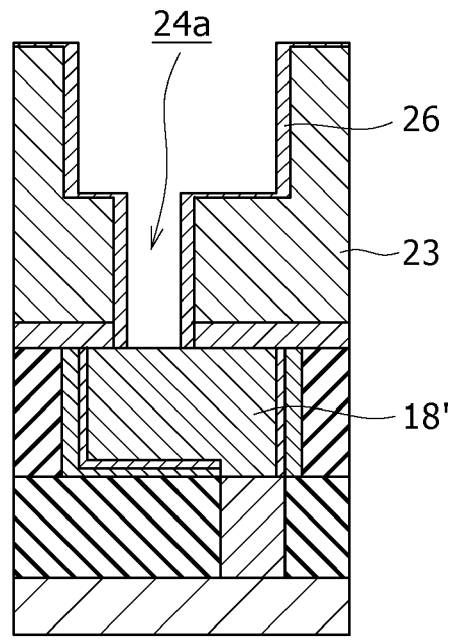

Subsequently, as shown in FIG. 5H, in order to expose the surface of the wiring 18', etching back under low pressure conditions is carried out to remove the porous film 26 from the bottom of the contact hole 24a. This etching back enables the porous film 25 at the bottom of the wiring groove 24b and on the interlayer insulating film 23 to be thinned.

Figure 5I:
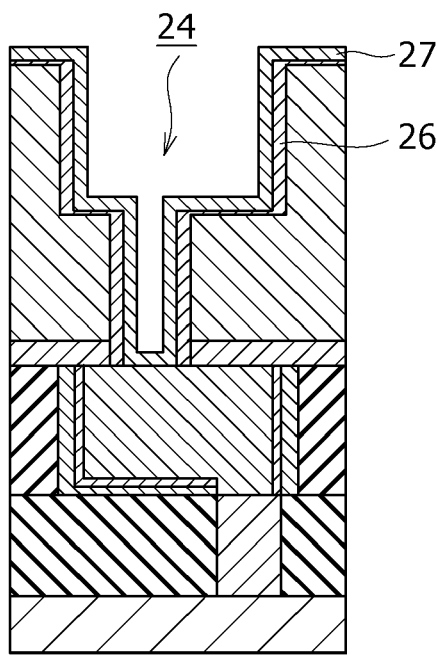

As shown in FIG. 5I, an alloy layer 27 made of CuMn is formed on the porous film 26 so as to cover the inner walls of the dual damascene opening 24. In the same manner as in the first embodiment, the concentration of Mn in the alloy layer 27 ranges from 1 atomic percent to 10 atomic percent, preferably from 2 atomic percent to 6 atomic percent. The thickness of the alloy layer 27 ranges from 20 nm to 80 nm.

Figure 5J:
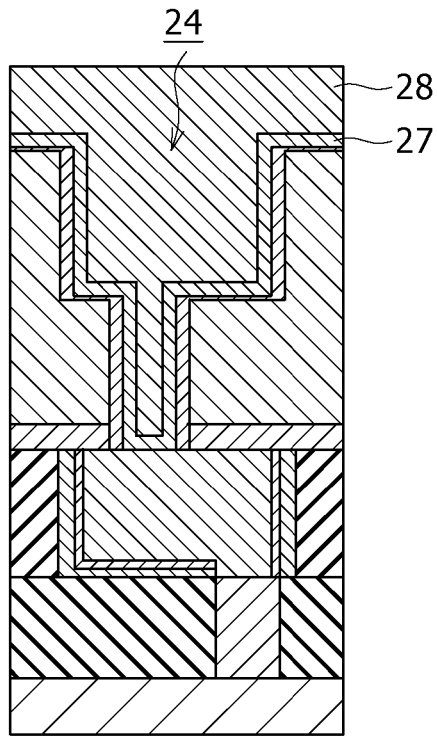

Next, as shown in FIG. 5J, a conductive layer 28 made, for example of pure Cu is formed on the alloy layer 27 so as to bury the dual damascene opening 24.

Figure 5K:
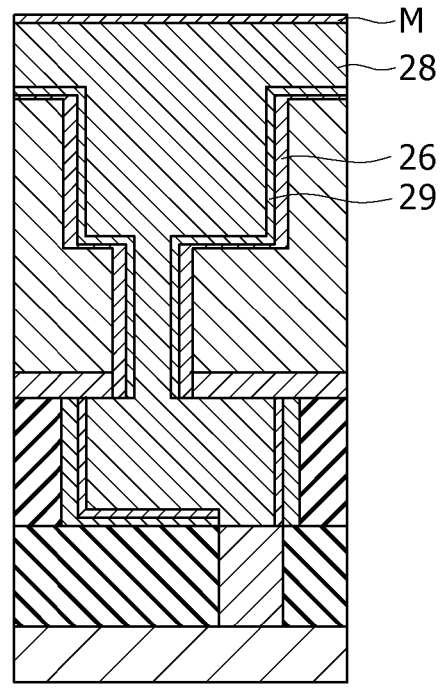

Next, as shown inn FIG. 5K, thermal treatment is carried out, for example, at 300° C. for 30 minutes to cause Mn in the alloy layer 27 (see FIG. 5J) to react with the constituent component of the porous film 26 to form a self-formed barrier film 29 made of a Mn compound between the alloy layer 27 and the porous film 26. Like the first embodiment, the porous film 26 is constituted of a porous SiOC film herein, so that the self-formed barrier film 29 is formed of $MnSi_xO_y$, or $Mn_xO_y$, with a thickness being at 2 nm to 3 nm. The thermal treatment causes Mn to be segregated at the surface side of the conductive layer 28, then a MnO layer M is formed.

Figure 5L:
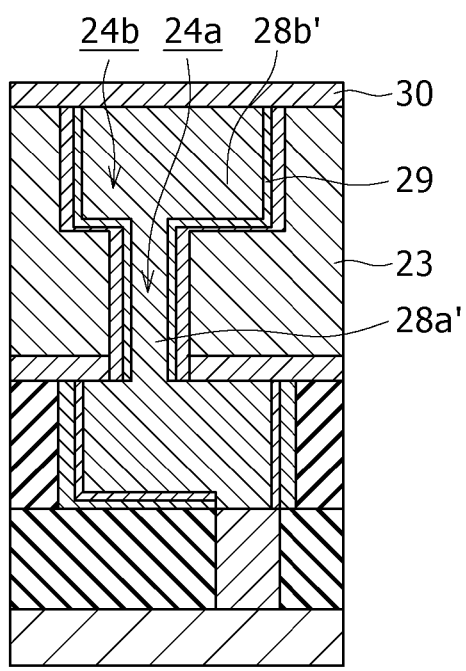

Thereafter, as shown in FIG. 5L, the conductive layer 28 at portions unnecessary for a wiring pattern (see FIG. 5K) and the self-formed barrier film 29 are removed along with the MnO layer M (see FIG. 5K), for example, by a CMP method, and the resulting exposed interlayer insulating film is polished down by 100 nm. In this way, a via 28a' in communication with the wiring 18' is formed in the contact hole 24a, and a wiring 28b' is formed in the wiring groove 24b.

Thereafter, rinsing with an organic acid is effected to remove the oxide film from the wiring 28b' and an anticorrosive for Cu left on the surface of the wiring 28b'. Subsequently, a cap film 30 made, for example, of SiCN is formed on the wiring 28b' and the interlayer insulating film 23 in a thickness of 50 nm.

When the porous film 26 is formed to cover the inner walls of the dual damascene opening 24 according to such a manufacturing method of a semiconductor device, effects as in the first embodiment can be attained.

Third Embodiment

In this embodiment, an instance wherein the interlayer insulating film 23 illustrated with reference to FIG. 5A in the second embodiment is made up of a hybrid structure having a porous insulating film thereby porositizing at least a part of the dual damascene opening at a side of inner walls thereof is illustrated. It will be noted that like parts or members in the second embodiment are indicated by like reference symbols, respectively.

Figure 6A:
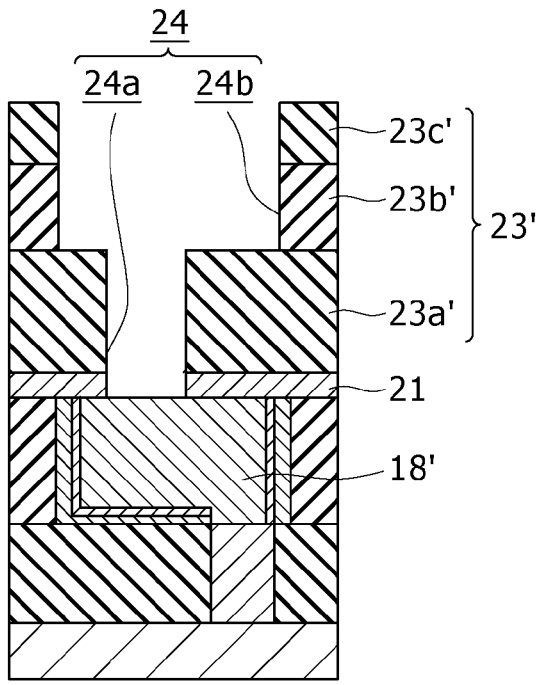
FIGS. 6A to 6E are, respectively, a sectional view showing a manufacturing step illustrating a third embodiment relating to a manufacturing method of a semiconductor device according to an embodiment of the present invention.

As shown in FIG. 6A, there are formed, on the cap film 21, an interlayer insulating film 23' that is formed by successively laminating an inorganic insulating layer 23a' made, for example, of a porous SiOC film, an organic insulating film 23b' made, for example, of a porous PAE film and a non-porous hard mask 23c' made of a $SiO_2$ film. The densities of the respective layers are such that SiOC film 32 1.3 $g/cm^3$, PAE film=1.05 $g/cm^3$ and $SiO_2$ film=2.3 $g/cm^3$. Although the hard mask 23c' has been stated herein as being formed of a non-porous SiO$_2$ film, the mask may be formed of a porous film made of a porous SiO$_2$ film.

The inorganic insulating film 23a' made of a porous SiOC film is formed by a coating method or a plasma CVD method. The organic insulating film 23b' made of a porous PAE film is formed by a coating method. The hard mask 23c' made of a SiO$_2$ film is formed by a plasma CVD method.

Next, a dual damascene opening 24 composing of a contact hole 24a arriving at the cap film 21 and a wiring groove 24b is formed in the interlayer insulating film 23' of this structure. The contact hole 24a is formed in the inorganic insulating layer 23, and the wiring grove 24b is formed in the hard mask layer 23c' and the organic insulating layer 23b'. In this manner, the contact holes 24a is rendered porous at side walls thereof along with a part of the side walls and the bottom of the wiring groove 24b, for which at least a part of the inner wall side of the dual damascene opening 24 is in a porositized state.

Since the inorganic insulating layer 23a' forming the bottom of the wiring groove 24b is constituted of a porous film, the formation of a self-formed barrier film at the interface between a conductive layer buried in the wiring groove 24b and the inorganic insulating film 23a' is facilitated at the bottom side of the wiring groove 24b. Accordingly, if stress is applied from lateral directions upon removal of the conductive layer at portions unnecessary for a wiring pattern according to a CMP method after burying the dual damascene opening 24 with a conductive layer in subsequent steps, adhesion between the conductive layer and the inorganic insulating layer 23a' at the bottom of the wiring groove 24b is improved, thereby reliably preventing film separation by the polishing.

For the method of forming the dual damascene opening 24, there can be used a method wherein the contact hole 24a is initially made and the wiring groove 24b is subsequently formed. Alternatively, there may be used a method wherein after formation of a wiring groove pattern in the laminated hard mask (not shown) formed on the interlayer insulating film 23, the contact hole 24b is formed partway in the interlayer insulating film 23', followed by full formation of the wiring groove 24a and the contact hole 24b by use of the laminated film. The details of this method are set out, for example, in Japanese Patent Laid-open No. 2004-63859.

As stated hereinabove, after the formation of the contact hole 24a and the wiring groove 24b in the interlayer insulating film 23', the cap film 21 at the bottom of the contact hole 24a is removed to expose the wiring 18'.

Figure 6B:
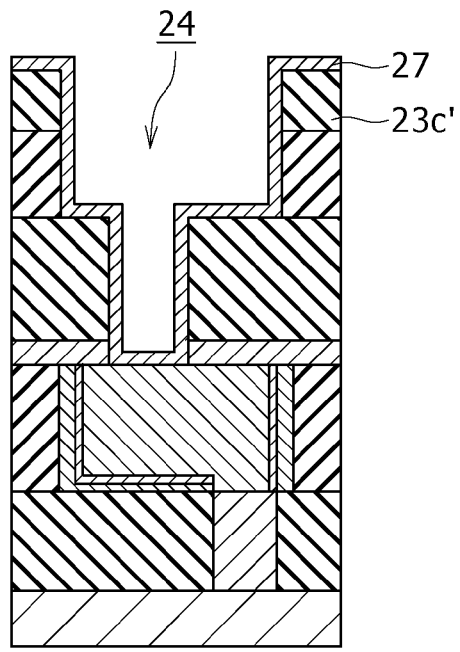

Subsequent steps are carried out in the same manner as those steps illustrated with reference to FIGS. 5I to 5L. More particularly, as shown in FIG. 6B, an alloy layer 27 made of CuMn is formed on the hard mask 23c' so as to cover the inner walls of the dual damascene opening 24.

Figure 6C:
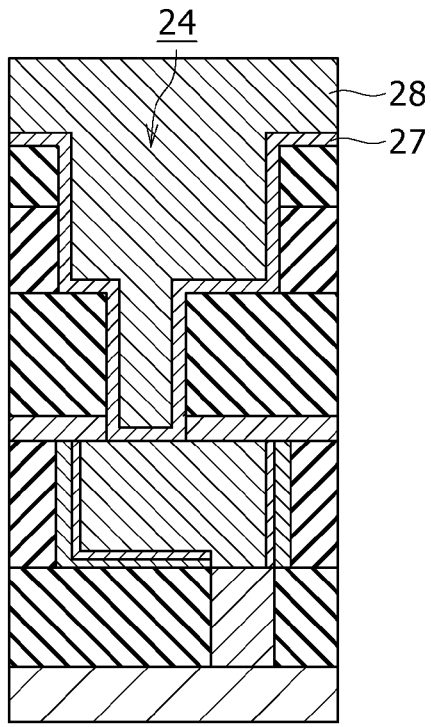

Next, as shown in FIG. 6C, a conductive layer 28 made, for example, of pure Cu is formed over the alloy layer 27 so as to bury the dual damascene opening 24.

Figure 6D:
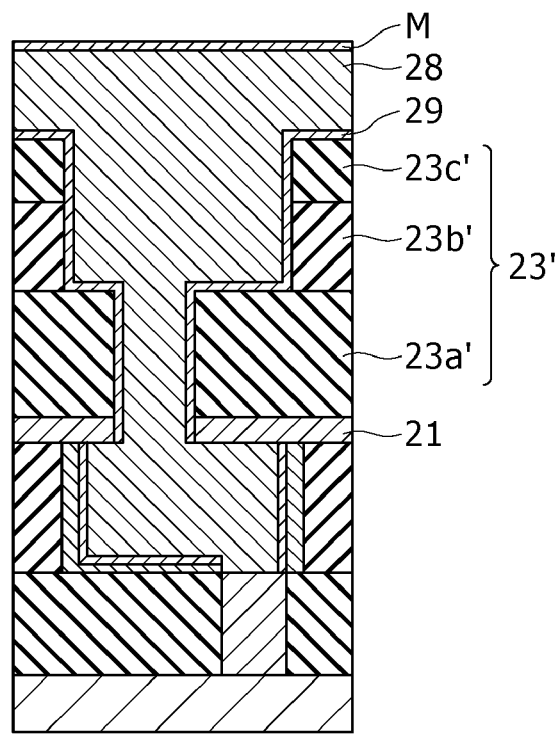

As shown in FIG. 6D, thermal treatment is carried out, for example, at 300° C. for 30 minutes to cause Mn in the alloy layer 27 (see FIG. 6C) to react with the constituent component of the interlayer insulating film 23' thereby forming a self-formed barrier film 29 made of a Mn compound between the alloy layer 27 and the interlayer insulating film 23'. The interlayer insulating film 23' is constituted by successively laminating a porous SiOC film, a porous PAE film and a SiO$_2$ film, and the cap film 21 is formed of SiCN, for which the self-formed barrier film 29 is constituted as containing any of a silicon-containing Mn oxide (MnSi$_x$O$_y$), an Mn oxide (Mn$_x$O$_y$) and a Mn carbide (Mn$_x$C$_y$) and is formed in a thickness of 2 nm to 3 nm. In this connection, Mn is also segregated at a surface side of the conductive layer 28 and thus, a MnO layer M is formed.

Figure 6E:
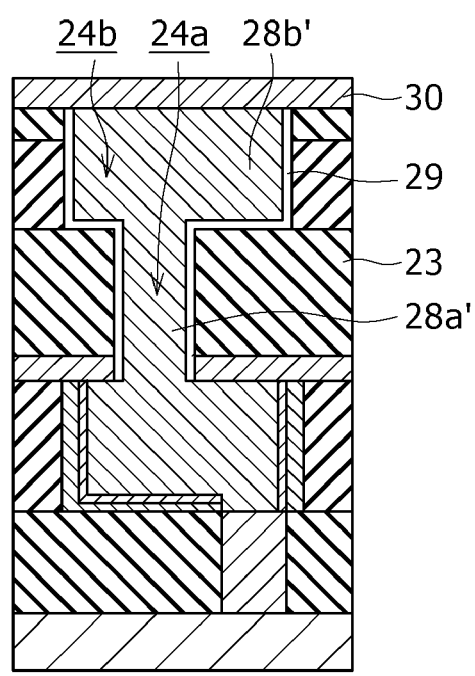
Figure 7A:
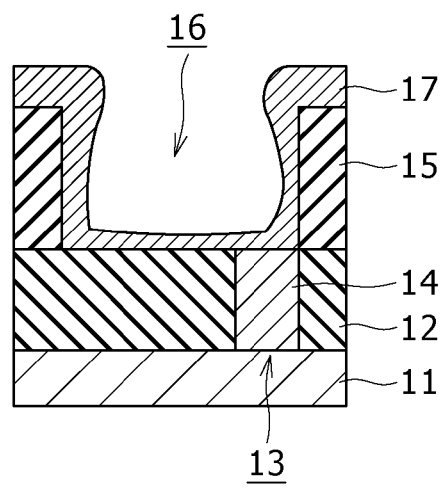
FIGS. 7A to 7C are, respectively, a manufacturing step illustrating a manufacturing method of a semiconductor device in the past.
Figure 7B:
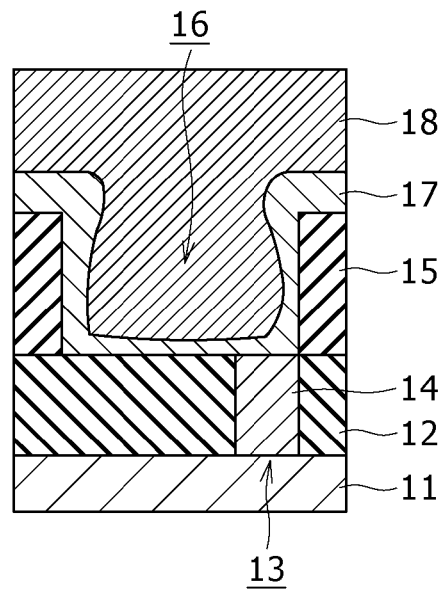
Figure 7C:
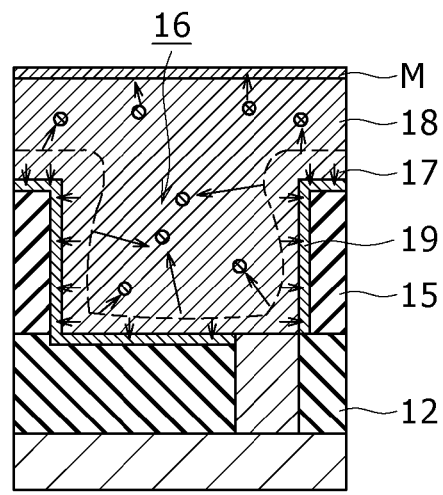
Figure 8:
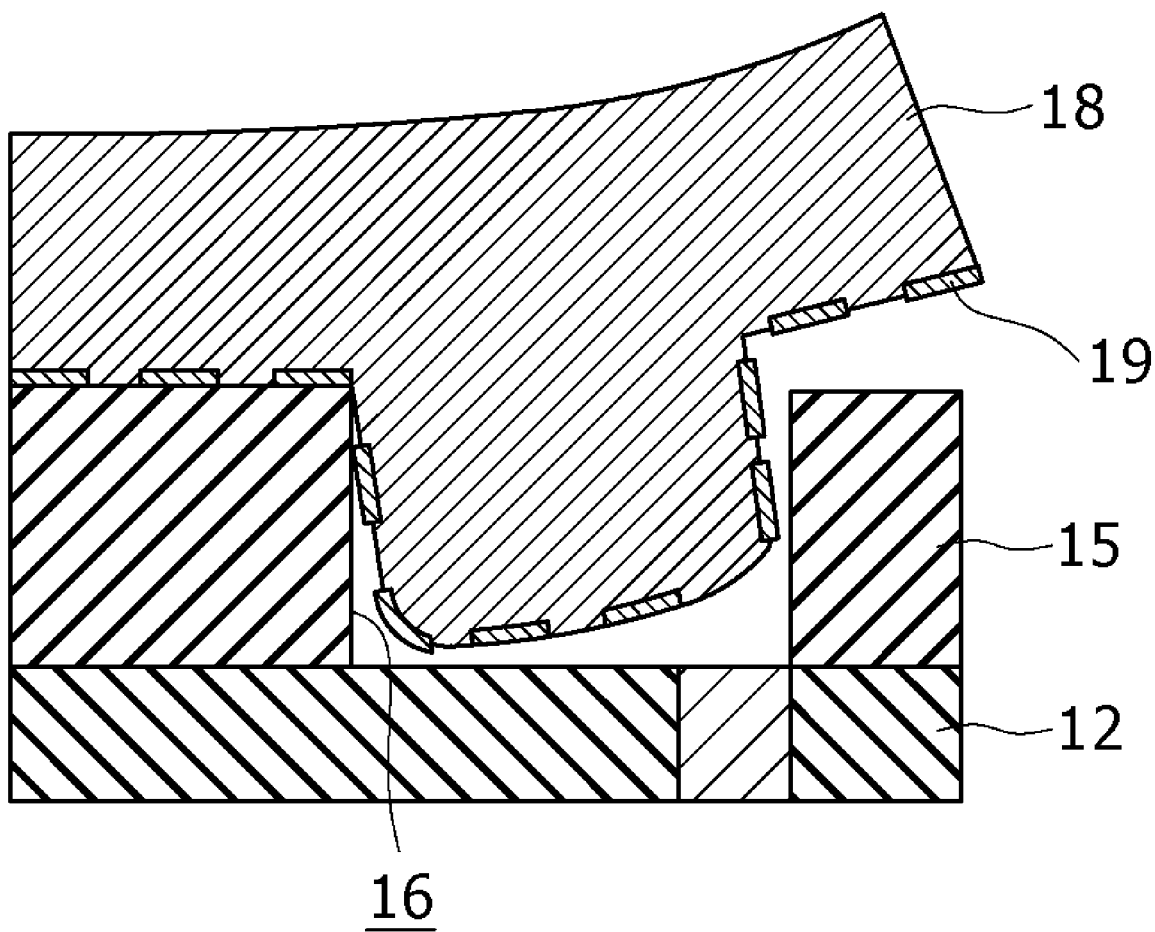
FIG. 8 is a sectional view illustrating a problem involved in the manufacturing method of a semiconductor device in the past.

Thereafter, as shown in FIG. 6E, two-stage polishing is carried out, for example, by a CMP method to remove the MnO layer M (see FIG. 6D), the conductive layer 28 at portions unnecessary for a wiring pattern (see FIG. 6D) and the self-formed barrier film 29, and the exposed hard mask 23' is polished down by 100 nm. In this way, a via 28a' communicated with the wiring 18' is formed in the contact hole 24a along with a wiring 28b' being formed in the wiring groove 24b'.

Next, rinsing with an organic acid is effected to remove the oxide film from the wiring 28b' and an anticorrosive for Cu left on the surface of the wiring 28b'. Thereafter, a cap film 30 made, for example, of SiCN is formed on the wiring 28b' and the interlayer insulating film 23 in a thickness of 50 nm.

According to this manufacturing method of a semiconductive device, at least a part of the dual damascene opening 24 at the inner wall side thereof is rendered porous, so that similar effects as in the second embodiment can be achieved.

Although, in the foregoing first to third embodiments, instances wherein the alloy layers 17a, 24a are, respectively, formed of CuMn have been illustrated, metals other than Cu used as a constituent of the alloy layers 17a, 24a include, aside from Mn, aluminium (Al), zinc (Zn), chromium (Cr), vanadium (V), titanium (Ti) and tantalum (Ta). For example, where the alloy layers 17, 27 are, respectively, formed of CuAl, the self-formed barrier films 19, 29 are, respectively, formed, for example, of at least one of a silicon-containing Al oxide (AlSi$_x$O$_y$), an Al oxide (Al$_x$O$_y$) and an Al carbide (Al$_x$C$_y$) Likewise, if the alloy layers 17, 27 are made of CuZn, the self-formed barrier films 19, 29 are, respectively, formed, for example, of at least one of a silicon-containing Zn oxide (ZnSi$_x$O$_y$), a Zn oxide (Zn$_x$O$_y$) and a Zn carbide (Zn$_x$C$_y$).

EXAMPLE

The manufacturing method of a semiconductor device according to an embodiment of the present invention is more particularly described.

Example 1

In Example 1, substantially in the same configuration as on the cap film 21 of the third embodiment, an interlayer insulating film 23' was formed by successively laminating, on a silicon substrate, an inorganic insulating layer 23a' made of a porous SiOC film having a density of 1.25 g.cm$^3$, an organic insulating layer 23b' made of a porous PAE film and a hard mask layer 23c' made of a SiO$_2$ film. Thereafter, a wiring groove 24b was formed in the hard mask layer 23c' and the organic insulating layer 23b'. An alloy layer 27 made of CuMn was formed on the hard mask layer 23c' so as to cover the inner walls of the wiring groove 24b, after which a conductive layer 28 was formed to bury the recess, followed by thermal treatment to form a self-formed barrier film 29 made of a Mn compound at the interface between the interlayer insulating film 23' and the cap film 21. Subsequently, the conductive layer 28 at portions unnecessary for a wiring pattern and the self-formed barrier film 29 were polished and removed according to a CMP method, and the resulting exposed interlayer insulating film 23' was polished down to form a wiring 28' inside the wiring groove 24b.

Comparative Example 1

For Comparative Example 1 relative to the above Example 1, a thermal oxide film ($SiO_2$ film) having a density of 2.2 g/cm$^3$ was formed, in place of the porous SiOC film in Example 1, by oxidizing the surface of a silicon substrate, and subsequent steps were conducted in the same manner as in Example 1.

The semiconductor devices of Example 1 and Comparative Example 1 were compared with each other with respect to film separation after CMP. The results are shown in Table 1 below.

TABLE 1

|  | Insulating film forming a bottom of the recess | Density (g/cm$^3$) | Separation of conductive layer |
|---|---|---|---|
| Example 1 | Porous SiOC film (porous coated film) | 1.25 | No |
| Comparative Example 1 | Thermal oxide film (non-porous $SiO_2$ film) | 2.2 | Film separation over an entire region |

As shown in the above table, it has been confirmed that with the semiconductor device of Comparative Example 1 wherein the bottom of the wiring groove 24b is constituted of the $SiO_2$ film (non-porous film) having a density of 2.2 g/cm$^3$, film separation takes place after CMP substantially over an entire region. On the other hand, with the semiconductor device of Example 1 wherein the bottom of the wiring groove 24b is formed of the porous SiOC film (porous film) having a density of 1.25 g/cm$^3$, no film separation has been observed. From the above results, it has been confirmed that when the insulating film at the bottom of the wiring groove 24b is formed of a porous film having a density of 1.5 g/cm$^3$, the formation of the self-formed barrier film 29 is promoted and thus, separation of the conductive layer 28 can be prevented.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device comprising:
   the first step of forming, in an insulating film provided on a substrate, a recess that is porositized at least at inner walls;
   the second step of forming an alloy layer made of copper and a metal other than copper so as to cover the inner walls of the recess;
   the third step of burying a conductive layer made primarily of copper in said recess provided with the alloy layer;
   the fourth step of subjecting the thus treated substrate to thermal treatment to cause said metal in said alloy layer to react with a constituent component of said insulating film to form a barrier film made of a metal compound having Cu diffusion barrier properties.

2. The method according to claim 1, wherein said recess is a wiring groove, or a wiring groove and a contact hole communicated with a bottom of the wiring groove, and the bottom of said wiring groove is constituted of a porous insulating film.

3. The method according to claim 1, wherein in the first step, said recess covered with a porous insulating film on inner walls is formed and, in the fourth step, thermal treatment is carried out to cause said metal in said alloy layer to react with the constituent component of said porous insulating film to form said barrier film at the interface between said alloy layer and said porous insulating film.

4. The method according to claim 1, wherein said insulating film has a density of not larger than 1.5 g/cm$^3$ at a porositized portion.

5. The method according to claim 1, wherein said metal other than copper is selected from the group composing of Mn, Al, Zn, Cr, V, T and Ta.

6. A semiconductor device comprising:
   an insulating film provided on a substrate; and
   a conductive layer buried in a recess formed in said insulating film and made primarily of copper,
   wherein
   at least a part of said insulating film provided at a side of interface with said conductive layer is porositized, and a barrier film made of a metal compound having copper diffusion barrier properties and formed by reaction with said insulating film and a metal other than copper is provided at the interface between said conductive layer and said insulating film.

7. The semiconductor device according to claim 6, wherein said metal other than copper is selected from the group composing of Mn, Al, Zn, Cr, V, T and Ta.

8. A method for manufacturing a semiconductor device, which comprising:
   the first step of forming a recess in an insulating film provided on a substrate;
   the second step of subjecting said insulating film to plasma treatment to form, at inner walls of said recess, a modified layer whose density is lower than said insulating film;
   the third step of forming an alloy layer made of copper and a metal other than copper over said modified layer so as to cover the inner walls of said recess;
   the fourth step of burying a conductive layer made mainly of copper in said recess provided thereon with said alloy layer; and
   the fifth step of subjecting the resulting substrate to thermal treatment to cause said metal in said alloy layer to react with a constituent component of said modified layer to form a barrier film mad of a metal compound having Cu diffusion barrier properties at an interface between said alloy layer and said modified layer.

9. The method according to claim 8, wherein said modified layer has a density of not larger than 1.5 g/cm$^3$.

10. The method according to claim 8, wherein said metal other than copper is selected from the group composing of Mn, Al, Zn, Cr, V, T and Ta.

11. A semiconductor device comprising:
    an insulating film provided on a substrate; and
    a conductive layer buried in a recess formed in said insulating film and made primarily of copper,
    wherein
    a modified layer whose density is lower than said insulating film is formed at an interface side of said insulating film with said conductive layer, and a barrier film made of a metal compound which is obtained by reaction of said modified layer with a metal other than copper and has copper diffusion barrier properties.

* * * * *